United States Patent
Doering et al.

(10) Patent No.: US 11,456,736 B2
(45) Date of Patent: Sep. 27, 2022

(54) CIRCUIT ARRANGEMENT, POWER CONVERTER MODULE, AND METHOD FOR OPERATING THE POWER CONVERTER MODULE

(71) Applicant: Siemens Energy Global GmbH & Co. KG, Munich (DE)

(72) Inventors: David Doering, Herzogenaurach (DE); Gerald Franz Giering, Kalchreuth (DE); Klaus Wuerflinger, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 17/045,228

(22) PCT Filed: Apr. 3, 2018

(86) PCT No.: PCT/EP2018/058454
§ 371 (c)(1),
(2) Date: Oct. 5, 2020

(87) PCT Pub. No.: WO2019/192674
PCT Pub. Date: Oct. 10, 2019

(65) Prior Publication Data
US 2021/0167768 A1    Jun. 3, 2021

(51) Int. Cl.
*H03K 17/0814* (2006.01)
*H01L 25/075* (2006.01)
(Continued)

(52) U.S. Cl.
CPC ... *H03K 17/08146* (2013.01); *H01L 25/0756* (2013.01); *H02M 3/06* (2013.01); *H03K 17/08148* (2013.01); *H03K 17/107* (2013.01)

(58) Field of Classification Search
CPC ...... H03K 17/00; H03K 17/08; H03K 17/081; H03K 17/08104; H03K 17/08112;
(Continued)

(56) References Cited

U.S. PATENT DOCUMENTS

2009/0127685 A1    5/2009  Jong et al.
2010/0085785 A1*   4/2010  Dommaschk ........... H02M 1/32
                                                 363/54
(Continued)

FOREIGN PATENT DOCUMENTS

| CN | 101246877 A | 8/2008 |
| EP | 3107109 A1 | 12/2016 |
| KR | 20060028487 A | 3/2006 |

OTHER PUBLICATIONS

English translation of EP 3107109 (Year: 2016).*

*Primary Examiner* — Thienvu V Tran
*Assistant Examiner* — Carlos O Rivera-Perez
(74) *Attorney, Agent, or Firm* — Laurence A. Greenberg; Werner H. Stemer; Ralph E. Locher

(57) ABSTRACT

A circuit arrangement includes a plurality of switch assemblies connected in series, each provided with a parallel circuit of three assembly components, in which a first assembly component is a semiconductor switch, a second assembly component is a freewheeling diode, and a third assembly component is a surge arrester. The assembly components are disposed one above the other or next to one another as an assembly component stack, the three assembly components of each switch assembly are disposed in the assembly component stack in a consecutive manner. Each two adjacent assembly components are electrically connected to one another by a direct connection. A power converter module and a method for operating a power converter module are also provided.

11 Claims, 4 Drawing Sheets

(51) Int. Cl.
*H02M 3/06* (2006.01)
*H03K 17/10* (2006.01)

(58) Field of Classification Search
CPC ......... H03K 17/0814; H03K 17/08128; H03K 17/08146; H03K 17/08148; H03K 17/0826; H03K 17/0828; H03K 17/10; H03K 17/107; H02M 3/00; H02M 3/02; H02M 3/04; H02M 3/06; H02M 3/07; H02M 1/32; H02M 1/325; H02M 1/34–348; H02M 7/00; H02M 7/003; H02M 7/02; H02M 7/04; H02M 7/12; H02M 7/125; H02M 7/155; H02M 7/162; H02M 7/17; H02M 7/19; H02M 7/219; H02M 7/42; H02M 7/44; H02M 7/483; H02M 7/4833; H02M 7/4835; H02M 7/4837; H02M 7/5387; H01L 25/00; H01L 25/03; H01L 25/04; H01L 25/075; H01L 25/0756; H01L 25/167; H01L 27/0248; H01L 27/0251; H01L 27/0255; H01L 27/0259; H01L 27/0266; H02H 3/00; H02H 3/20–22; H01T 4/00; H01T 4/02; H01T 4/04; H01T 4/08
USPC ........ 363/50–58, 141, 146, 147; 361/54, 56, 361/67, 88–92, 111, 117–138
See application file for complete search history.

(56) References Cited

U.S. PATENT DOCUMENTS

2017/0280577 A1* 9/2017 Laneryd ................. F28D 1/022
2019/0229103 A1* 7/2019 Tatsumi ................. H01L 24/16

* cited by examiner

# CIRCUIT ARRANGEMENT, POWER CONVERTER MODULE, AND METHOD FOR OPERATING THE POWER CONVERTER MODULE

BACKGROUND OF THE INVENTION

Field of the Invention

The invention relates to a circuit arrangement having a plurality of switch assemblies connected in series and each having a semiconductor switch, to a power converter module having a circuit arrangement of this type, and to a method for operating the power converter module.

During operation of a semiconductor switch such as an insulated gate bipolar transistor (IGBT), a voltage between the load terminals of the semiconductor switch (between the collector and the emitter in the case of an IGBT) must not exceed a maximum voltage in order that the semiconductor switch is not damaged or destroyed. This is necessary in the case of a series circuit of semiconductor switches, in particular, in which a voltage present across the series circuit is divided among the individual semiconductor switches. In the case of a series circuit of semiconductor switches, the situation can occur, in particular, that a semiconductor switch fails on account of a defect and can no longer take up voltage, as a result of which the other semiconductor switches are exposed to a higher voltage. In order to prevent overvoltages across series-connected IGBTs in the case of failure of an IGBT, for example gate protective circuits of the IGBT (so-called active clamping) or passive protective circuits of the IGBT are known. Series circuits of semiconductor switches are used particularly in power converter modules.

SUMMARY OF THE INVENTION

The invention is based on the object of specifying a circuit arrangement having semiconductor switches connected in series, in particular for a power converter module, which circuit arrangement is improved in particular with regard to the protection of the semiconductor switches against overvoltages in the event of failure of one semiconductor switch or a plurality of semiconductor switches.

The object is achieved according to the invention by means of a circuit arrangement comprising
  a plurality of switch assemblies connected in series and each having a parallel circuit of three assembly components, wherein
  a first assembly component is a semiconductor switch, a second assembly component is a freewheeling diode and the third assembly component is a surge arrester,
  the assembly components are arranged as an assembly component stack and the three assembly components of each switch assembly are arranged successively in the assembly component stack,
  each two mutually adjacent assembly components are electrically directly connected to one another by a direct connection,
  each direct connection that connects two assembly components of two different switch assemblies is electrically connected to each of the two direct connections second closest to it by means of a bridge connection, and
  each stack end of the assembly component stack has an electrical stack terminal that is electrically connected by means of an end bridge connection to the direct connection of two assembly components that is second closest to the stack end.

A power converter module comprises
  a series circuit of a plurality of switch assemblies, each having a parallel circuit of three assembly components, wherein a first assembly component is a semiconductor switch, a second assembly component is a freewheeling diode and the third assembly component is a surge arrester,
  a capacitor circuit having at least one capacitor, said capacitor circuit being connected to the two ends of the series circuit, and
  two module terminals, which are end terminals of a partial series circuit formed by a first assembly subset of the switch assemblies,
  wherein the assembly components of all the switch assemblies or of at least one subset of the switch assemblies form a circuit arrangement according to the invention.

A method for operating a power converter module according to the invention, includes the first assembly subset of the power converter module having at least two switch assemblies and the power converter module having a second assembly subset with at least two switch assemblies, said second assembly subset being complementary to the first assembly subset, and for uptake of energy by the power converter module, at least one semiconductor switch of at least one assembly subset is switched off and at least one semiconductor switch of the same assembly subset is switched on.

The dependent claims relate to advantageous configurations of the invention.

A circuit arrangement according to the invention comprises a plurality of switch assemblies connected in series and each having a parallel circuit of three assembly components, wherein a first assembly component is a semiconductor switch, a second assembly component is a freewheeling diode and the third assembly component is a surge arrester. The assembly components are arranged (spatially one above another or next to one another) as an assembly component stack, wherein the three assembly components of each switch assembly are arranged successively in the assembly component stack. Each two mutually adjacent assembly components are electrically directly connected to one another by a direct connection. Each direct connection that connects two assembly components of two different switch assemblies is electrically connected to each of the two direct connections second closest to it by means of a bridge connection. Each stack end of the assembly component stack has an electrical stack terminal that is electrically connected by means of an end bridge connection to the direct connection of two assembly components that is second closest to the stack end.

Two assembly components are referred to as mutually adjacent if no further assembly component is arranged between the two assembly components in the assembly component stack. A direct connection is referred to as a direct connection second closest to another direct connection if the assembly component stack has exactly one further direct connection of two assembly components between the two direct connections. Accordingly, a direct connection is referred to as the direct connection that is second closest to a stack end if the assembly component stack has exactly one further direct connection of two assembly components between the stack end and this direct connection.

The surge arrester of a switch assembly limits a voltage present across the semiconductor switch, that is to say a voltage between the load terminals of the semiconductor switch, to a maximum value in order to prevent an overvoltage across the semiconductor switch. This in particular prevents a defect of the semiconductor switch of one switch assembly from causing an overvoltage across the semiconductor switch of another switch assembly. The invention furthermore provides a stacked arrangement of the assembly components, wherein the assembly components of each switch assembly are arranged successively. This advantageously enables a very simple and cost-effective realization of the interconnection of the stacked assembly components by means of direct connections that each connect two mutually adjacent assembly components, and also by means of bridge connections and end bridge connections that connect the direct connections to one another and the stack terminals. Overall, the invention enables a series circuit of semiconductor switches in which the semiconductor switches are protected against overvoltages and are arranged expediently and so as to save space in a stacked manner.

One configuration of the invention provides for the semiconductor switch and the freewheeling diode of each switch assembly to be arranged adjacent to one another. This arrangement of the semiconductor switch and the freewheeling diode of each switch assembly advantageously brings about a low-inductance arrangement of the semiconductor switch and the freewheeling diode of each switch assembly.

In a further configuration of the invention, the semiconductor switches are insulated gate bipolar transistors. In particular, each direct connection that connects two insulated gate bipolar transistors connects the emitter of one insulated gate bipolar transistor and the collector of the other insulated gate bipolar transistor. Furthermore, each direct connection that connects an insulated gate bipolar transistor and a freewheeling diode connects preferably either the emitter of the insulated gate bipolar transistor and the anode of the freewheeling diode or the collector of the insulated gate bipolar transistor and the cathode of the freewheeling diode. Insulated gate bipolar transistors combine advantages of bipolar transistors and field effect transistors and are therefore particularly suitable semiconductor switches, in particular for circuit arrangements for power converter modules.

In a further configuration of the invention, each bridge connection and/or each end bridge connection are/is embodied integrally with each direct connection connected thereto. This configuration of the invention reduces the number of components in the circuit arrangement.

A power converter module according to the invention comprises a series circuit of a plurality of switch assemblies, each having a parallel circuit of three assembly components, wherein a first assembly component is a semiconductor switch, a second assembly component is a freewheeling diode and the third assembly component is a surge arrester, a capacitor circuit having at least one capacitor, said capacitor circuit being connected to the two ends of the series circuit, and two module terminals, which are end terminals of a partial series circuit formed by a first assembly subset of the switch assemblies. In this case, the assembly components of all the switch assemblies or of at least one subset of the switch assemblies form a circuit arrangement according to the invention.

The advantages of a power converter module according to the invention are evident from the abovementioned advantages of a circuit arrangement according to the invention.

One configuration of the power converter module provides an even number of switch assemblies, wherein the cardinal number of the first assembly subset is half the magnitude of the number of switch assemblies. The cardinal number of a finite set is understood to mean the number of elements in the set. In other words, the first assembly subset of the power converter module in accordance with this configuration has exactly the same number of switch assemblies as a second assembly subset complementary to the first assembly subset. As a result, both assembly subsets can be embodied in the same way and control of the semiconductor switches can be improved and simplified.

A further configuration of the power converter module provides a housing, in which the switch assemblies, the capacitor circuit and a cooling medium are arranged. The cooling medium is an ester, for example. This configuration of the power converter module enables the power converter module to be cooled by a cooling medium. An ester is a particularly suitable cooling medium since it has high fire and flash points, a high ignition temperature, good electrical insulation properties and a high thermal storage capacity and moreover is nontoxic, readily biodegradable and does not pollute water.

The method according to the invention relates to operating a power converter module according to the invention, the first assembly subset of which power converter module has at least two switch assemblies and which power converter module has a second assembly subset having at least two switch assemblies, said second assembly subset being complementary to the first assembly subset. In the method, for uptake of energy by the power converter module, at least one semiconductor switch of at least one assembly subset of switch assemblies is switched off and at least one semiconductor switch of the same assembly subset of switch assemblies is switched on.

The method according to the invention exploits the fact that the arresters of a power converter module according to the invention can be used for taking up energy by at least one semiconductor switch of at least one switch assembly being switched off, while at least one semiconductor switch of the same switch assembly is switched on. In this case, an electric current flows through surge arresters and the latter are heated. In the case where the switch assemblies are arranged in a cooling medium, the heat is partly dissipated by the cooling medium. Thus, besides normal operation of the power converter module, the method according to the invention provides an additional operating mode of the power converter module, in which the power converter module is used to take up energy. This operating mode differs from the normal operation of the power converter module in that the semiconductor switches of at least one assembly subset are operated in mutually different switching states.

The above-described properties, features and advantages of this invention and the way in which they are achieved will become clearer and more clearly understood in association with the following description of exemplary embodiments which are explained in greater detail in association with the drawings.

DETAILED DESCRIPTION OF THE INVENTION

Mutually corresponding parts are provided with the same reference signs in the figures.

Figure 1:
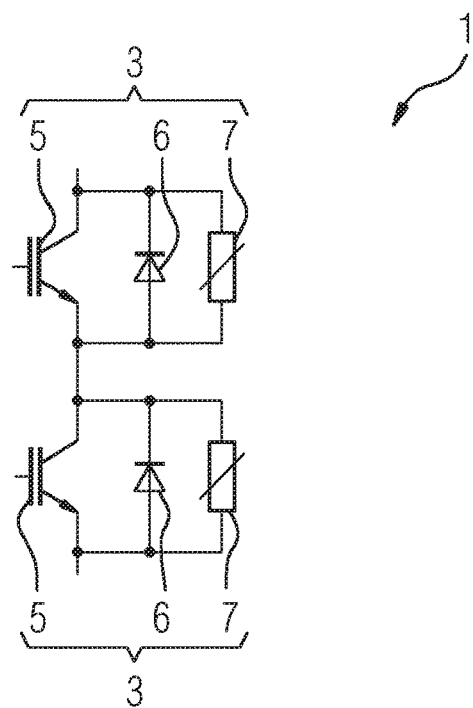
FIG. 1 shows a first circuit diagram of a circuit arrangement having two switch assemblies.
Figure 2:
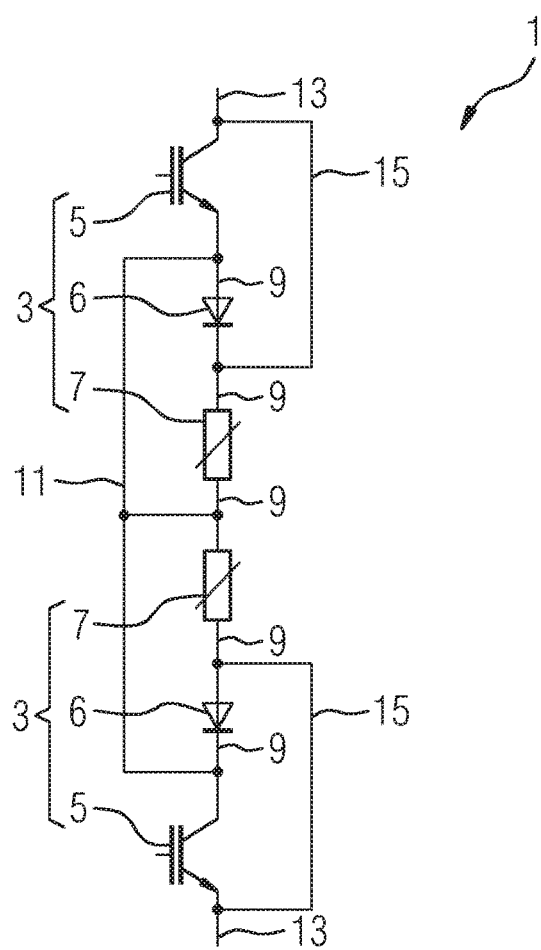
FIG. 2 shows a second circuit diagram of the circuit arrangement shown in FIG. 1, which circuit diagram corresponds to the spatial arrangement of the assembly components of the circuit arrangement, FIG. 3 schematically shows the spatial arrangement of the assembly components of the circuit arrangement shown in FIG. 1, FIG. 4 schematically shows a circuit arrangement having three switch assemblies in an illustration corresponding to FIG. 3, FIG. 5 schematically shows a circuit arrangement having four switch assemblies in an illustration corresponding to FIG. 3.
Figure 3:
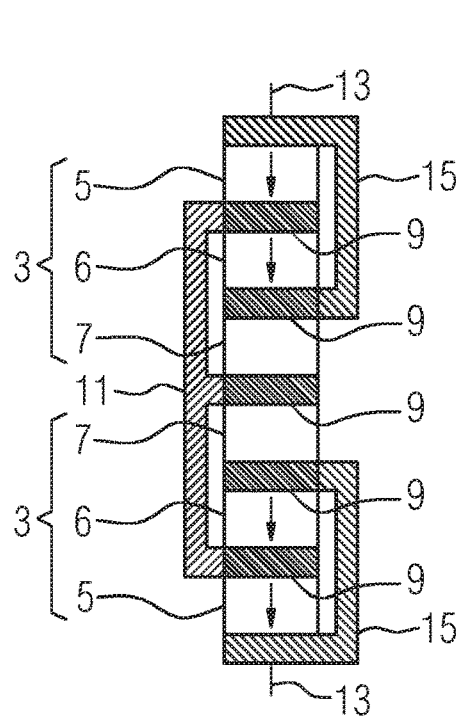

FIGS. 1 to 3 show a circuit arrangement 1 according to the invention having two switch assemblies 3 connected in series. Each switch assembly 3 has a parallel circuit of three assembly components 5 to 7, wherein a first assembly component is a semiconductor switch 5 embodied as an IGBT, a second assembly component is a freewheeling diode 6 and the third assembly component is a surge arrester 7.

FIGS. 1 and 2 show equivalent circuit diagrams of the circuit arrangement 1. FIG. 3 illustrates the spatial arrangement of the assembly components 5 to 7 of the circuit arrangement 1. The circuit diagram shown in FIG. 1 illustrates the electrical interconnection of the assembly components 5 to 7. The circuit diagram shown in FIG. 2 corresponds to the spatial arrangement of the assembly components 5 to 7 that is shown in FIG. 3.

The assembly components 5 to 7 are arranged spatially one above another as an assembly component stack. Each two mutually adjacent assembly components 5 to 7 are electrically directly connected to one another by a direct connection 9.

The freewheeling diode 6 of each switch assembly 3 is arranged between the semiconductor switch 5 and the surge arrester 7 of the switch assembly 3 and thus connected by a respective direct connection 9 to the semiconductor switch 5 and to the surge arrester 7 of the switch assembly 3. In this case, the anode of the freewheeling diode 6 of the upper switch assembly 3 is connected by a direct connection 9 to the emitter of the semiconductor switch 5 of the upper switch assembly 3 and the cathode of the freewheeling diode 6 of the lower switch assembly 3 is connected by a direct connection 9 to the collector of the lower switch assembly 3. In FIG. 3, the orientations of the semiconductor switches 5 with regard to the direction from the collector to the emitter and those of the freewheeling diodes 6 with regard to the direction from the anode to the cathode are represented in each case by an arrow.

The surge arresters 7 of the two switch assemblies 3 are arranged adjacent to one another and thus connected by a direct connection 9. The orders in which the assembly components 5 to 7 of the two switch assemblies 3 are arranged one behind another along the assembly component stack are therefore inverted relative to one another.

The direct connection 9 that connects the two surge arresters 7 is electrically connected by means of a bridge connection 11 to the two direct connections 9 of two assembly components 5 to 7 that are second closest to it, that is to say to the two direct connections 9 that respectively connect the freewheeling diode 6 to the semiconductor switch 5 of a switch assembly 3.

Each stack end of the assembly component stack has an electrical stack terminal 13 that is electrically connected by means of an end bridge connection 15 to the direct connection 9 of two assembly components 5 to 7 that is second closest to the stack end, that is to say to a direct connection 9 between a freewheeling diode 6 and a surge arrester 7 of a switch assembly 3.

Figure 4:
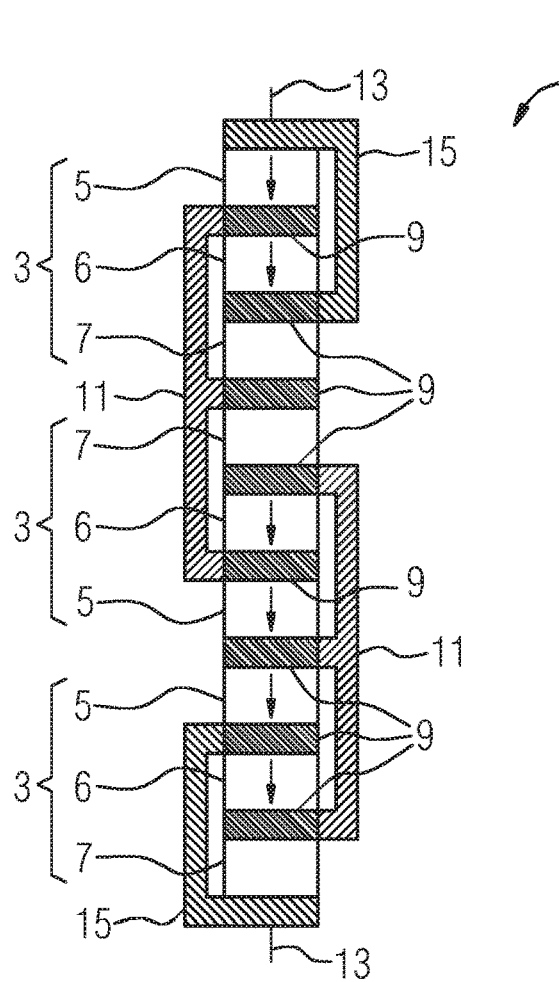
Figure 5:
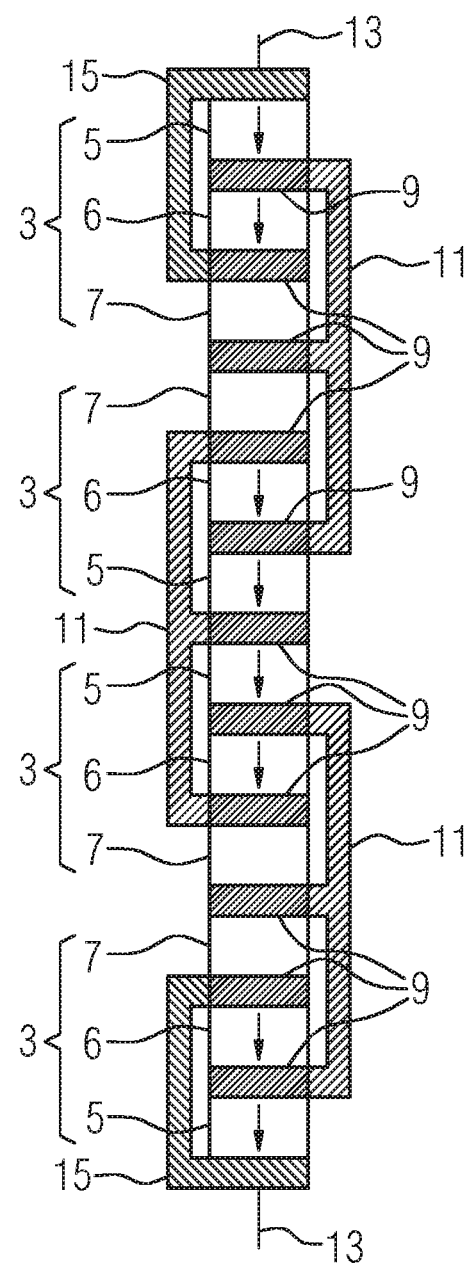

FIGS. 4 and 5 show further circuit arrangements 1 according to the invention in an illustration corresponding in each case to FIG. 3, wherein FIG. 4 shows a circuit arrangement 1 having three switch assemblies 3 and FIG. 5 shows a circuit arrangement 1 having four switch assemblies 3. As in FIGS. 1 to 3, each switch assembly 3 has a parallel circuit of three assembly components 5 to 7, wherein a first assembly component is a semiconductor switch 5 embodied as an IGBT, a second assembly component is a freewheeling diode 6 and the third assembly component is a surge arrester 7.

The assembly components 5 to 7 are arranged one above another as an assembly component stack. Each two mutually adjacent assembly components 5 to 7 are electrically directly connected to one another by a direct connection 9. The freewheeling diode 6 of each switch assembly 3 is arranged between the semiconductor switch 5 and the surge arrester 7 of the switch assembly 3, and thus connected by a respective direct connection 9 to the semiconductor switch 5 and to the surge arrester 7 of the switch assembly 3. In this case, either the anode of the freewheeling diode 6 of the switch assembly 3 is connected to the emitter of the semiconductor switch 5 or the cathode of the freewheeling diode 6 is connected to the collector of the switch assembly 3. As in FIG. 3, the orientations of the semiconductor switches 5 with regard to the direction from the collector to the emitter and those of the freewheeling diodes 6 with regard to the direction from the anode to the cathode are represented in each case by an arrow.

The two semiconductor switches 5 or the two surge arresters 7 of each two adjacent switch assemblies 3 are arranged adjacent to one another and are thus connected by a direct connection 9. In this case, each direct connection 9 that connects two semiconductor switches 5 connects the emitter of one semiconductor switch 5 and the collector of the other semiconductor switch 5.

Each direct connection 9 that connects two assembly components 5 to 7 of two different switch assemblies 3 is electrically connected to the two direct connections 9 of two assembly components that are second closest to it by means of a bridge connection 11. Consequently, each direct connection 9 that connects the surge arresters 7 of two switch assemblies 3 is electrically connected by means of a bridge connection 11 to the two direct connections 9 that respectively connect the freewheeling diode 6 to the semiconductor switch 5 of one of the two switch assemblies 3, and each direct connection 9 that connects the semiconductor switches 5 of two switch assemblies 3 is electrically connected by means of a bridge connection 11 to the two direct connections 9 that respectively connect the freewheeling diode 6 to the surge arrester 7 of one of the two switch assemblies 3.

As in the case of the circuit arrangement 1 shown in FIGS. 1 to 3, furthermore each stack end of the assembly component stack has an electrical stack terminal 13 that is electrically connected by means of an end bridge connection 15 to the direct connection 9 of two assembly components 5 to 7 that is second closest to the stack end.

In all the exemplary embodiments shown in FIGS. 1 to 5, the surge arrester 7 of a switch assembly 3 limits the voltage between the collector and the emitter of the semiconductor switch 5 of the switch assembly 3 to a maximum value provided for said semiconductor switch 5 in order to prevent an overvoltage between the collector and the emitter. If a voltage present across a second switch assembly 3 increases for example on account of a defect of a semiconductor switch 5 of a first switch assembly 3, then the surge arrester 7 of the second switch assembly 3 limits the voltage between the collector and the emitter of the semiconductor switch 5 of the second switch assembly 3 to the maximum value provided for said semiconductor switch 5 and thereby prevents said semiconductor switch 5 from being damaged or destroyed.

All the exemplary embodiments shown in FIGS. 1 to 5 can be modified to the effect that the order of the assembly components 5 to 7 of at least one switch assembly 3 (in particular also of all the switch assemblies 3) in the assembly component stack is changed by comparison with the order shown in the respective FIGS. 3 to 5. Preferably, however, the semiconductor switch 5 and the freewheeling diode 6 of each switch assembly 3 are arranged adjacent to one another.

Figure 6:
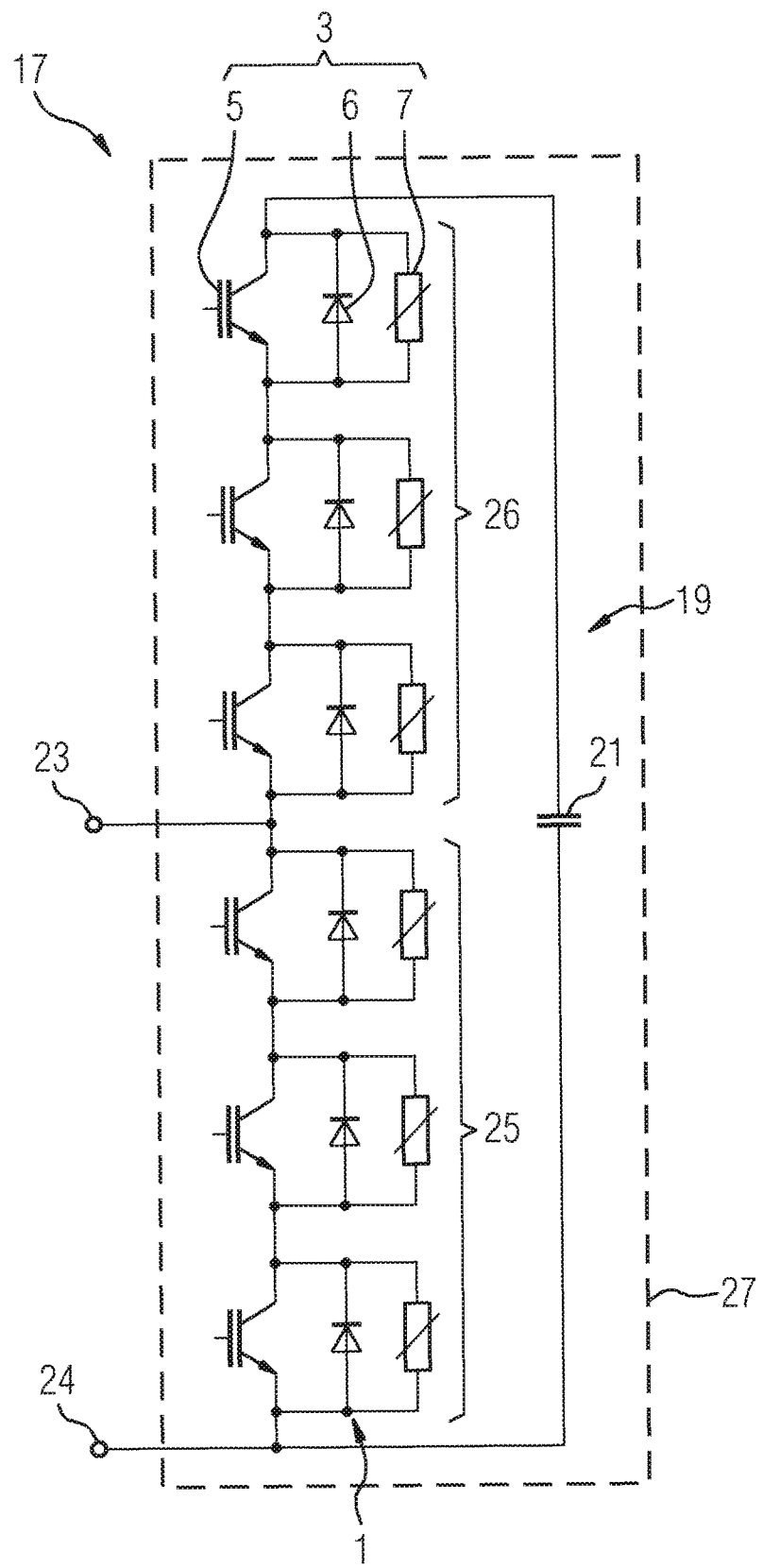
FIG. 6 shows a circuit diagram of a power converter module.

FIG. 6 shows a circuit diagram of a power converter module 17. The power converter module 17 has a series circuit of six switch assemblies 3, each having a parallel circuit of three assembly components 5 to 7, wherein a first assembly component is a semiconductor switch 5 embodied as an IGBT, a second assembly component is a freewheeling diode 6 and the third assembly component is a surge arrester 7.

The power converter module 17 furthermore has a capacitor circuit 19 connected to the two ends of the series circuit of the switch assemblies 3, which capacitor circuit has one capacitor 21 in the exemplary embodiment shown in FIG. 6, but can alternatively have a series circuit of a plurality of capacitors 21 in other exemplary embodiments.

Furthermore, the power converter module 17 has two module terminals 23, 24, which are end terminals of a partial series circuit formed by a first assembly subset 25 of the switch assemblies 3. A first module terminal 23 is a center terminal of the series circuit of the switch assemblies 3, and the second module terminal 24 is an end terminal of the series circuit and is connected to the capacitor circuit 19. The switch assemblies 3 of a second assembly subset 26 of the switch assemblies 3, said second assembly subset being complementary to the first assembly subset 25, thus form a further partial series circuit of switch assemblies 3 between the first module terminal 23 and the capacitor circuit 19. The assembly subsets 25, 26 are equivalent, that is to say that they each have three switch assemblies 3. The term "complementary" should be understood here as a term from set theory: the first assembly subset 25 of the switch assemblies 3 and the second assembly subset 26 (complementary to the first assembly subset) of the switch assemblies 3 thus together form the set (total set, assembly set) of the switch assemblies 3 of the power converter module 17.

All the switch assemblies 3 or at least one subset of the switch assemblies 3 form a circuit arrangement 1 configured analogously to one of the circuit arrangements 1 shown in FIGS. 1 to 5. By way of example, the switch assemblies 3 of the two assembly subsets 25, 26 in each case form a circuit arrangement 1 described with reference to FIG. 4.

The power converter module 17 furthermore has a housing 27, in which the switch assemblies 3, the capacitor circuit 19 and a cooling medium, for example an ester, are arranged in order to cool the power converter module 17.

In a first operating mode (normal operation) of the power converter module 17, the semiconductor switches 5 are operated alternately in a first switching state and a second switching state, wherein in the first switching state all the semiconductor switches 5 of the first assembly subset 25 are switched off and all the semiconductor switches 5 of the second assembly subset 26 are switched on, and in the second switching state all the semiconductor switches 5 of the first assembly subset 25 are switched on and all the semiconductor switches 5 of the second assembly subset 26 are switched off.

The invention furthermore provides a second operating mode of the power converter module 17, in which at least one semiconductor switch 5 of at least one assembly subset 25, 26 is switched off and at least one semiconductor switch 5 of the same assembly subset 25, 26 is switched on in order, by means of the power converter module 17, to take up energy, for example from an electrical grid connected to the power converter module 17 via the module terminals 23, 24. By way of example, with semiconductor switches 5 of the second assembly subset 26 switched off, one semiconductor switch 5 of the first assembly subset 25 is switched on and the other two semiconductor switches 5 of the first assembly subset 25 are switched off. An electric current can then flow between the module terminals 23, 24 via the switch assemblies 3 of the first assembly subset 25, which current flows partly via the surge arresters 7 of this switch assembly 3 and heats said surge arresters 7. The surge arresters 7 partly emit the heat absorbed by them to the cooling medium surrounding them.

Although the invention has been more specifically illustrated and described in detail by means of preferred exemplary embodiments, the invention is nevertheless not restricted by the examples disclosed and other variations can be derived therefrom by the person skilled in the art, without departing from the scope of protection of the invention.

LIST OF REFERENCE SIGNS

1 Circuit arrangement
3 Switch assembly
5 Semiconductor switch
6 Freewheeling diode
7 Surge arrester
9 Direct connection
11 Bridge connection
13 Stack terminal
15 End bridge connection
17 Power converter module
19 Capacitor circuit
21 Capacitor
23, 24 Module terminal
25, 26 Assembly subset
27 Housing

The invention claimed is:
1. A circuit arrangement, comprising:
a plurality of switch assemblies connected in series;
each of said plurality of switch assemblies having a parallel circuit of three assembly components including a first assembly component being a semiconductor switch, a second assembly component being a freewheeling diode and a third assembly component being a surge arrester;
said three assembly components being disposed as an assembly component stack and said three assembly components of each of said plurality of switch assemblies being disposed successively in said assembly component stack;
direct connections electrically directly connecting each two mutually adjacent assembly components to one another;
a bridge connection, each of said direct connections interconnecting two assembly components of a different two of said plurality of switch assemblies being electrically connected to each of two direct connections second closest to it by said bridge connection;
said assembly component stack having stack ends and electrical stack terminals each disposed at a respective one of said stack ends; and
end bridge connections each electrically connecting a respective one of said electrical stack terminals to said direct connection of two assembly components being second closest to said stack end;
wherein said assembly component stack is configured such that said surge arrester of a first one of said plurality of switch assemblies and said surge arrester of a second one of said plurality of switch assemblies are physically located between said freewheeling diode of said first one of said plurality of switch assemblies and said freewheeling diode of said second one of said plurality of switch assemblies, wherein said first one of said plurality of switch assemblies is physically located adjacent to said second one of said plurality of switch assemblies.

2. The circuit arrangement according to claim 1, wherein said semiconductor switch and said freewheeling diode of each of said switch assemblies are disposed adjacent one another.

3. The circuit arrangement according to claim 1, wherein said semiconductor switches are insulated gate bipolar transistors.

4. The circuit arrangement according to claim 3, wherein each of said direct connections interconnecting two of said insulated gate bipolar transistors interconnects an emitter of one of said insulated gate bipolar transistors and a collector of another of said insulated gate bipolar transistors.

5. The circuit arrangement according to claim 3, wherein each of said direct connections interconnecting one of said insulated gate bipolar transistors and a freewheeling diode interconnects either an emitter of one of said insulated gate bipolar transistors and an anode of said freewheeling diode or a collector of one of said insulated gate bipolar transistors and a cathode of said freewheeling diode.

6. The circuit arrangement according to claim 1, wherein at least one of each of said bridge connections or each of said end bridge connections is integral with each of said direct connections connected thereto.

7. A power converter module incorporating the circuit arrangement according to claim 1, the power converter module comprising:
a series circuit of a plurality of switch assemblies, said series circuit having two ends, and said plurality of switch assemblies including a first assembly subset forming a partial series circuit having end terminals;
each of said plurality of switch assemblies having a parallel circuit of three assembly components including the first assembly component being the semiconductor switch, the second assembly component being the freewheeling diode and the third assembly component being the surge arrester;
a capacitor circuit having at least one capacitor, said capacitor circuit being connected to said two ends of said series circuit; and
two module terminals forming said end terminals of said partial series circuit formed by said first assembly subset of said plurality of switch assemblies; and
said assembly components of all of said plurality of switch assemblies or of at least one subset of said plurality of switch assemblies forming the circuit arrangement according to claim 1.

8. The power converter module according to claim 7, wherein said switch plurality of assemblies include an even number of said plurality of switch assemblies, and said first assembly subset includes half of said even number of said switch assemblies.

9. The power converter module according to claim 7, which further comprises a housing, said plurality of switch assemblies, said capacitor circuit and a cooling medium being disposed in said housing.

10. The power converter module according to claim 9, wherein said cooling medium is an ester.

11. A method for operating the power converter module according to claim 7, the method comprising:
providing the power converter module according to claim 7;
providing said first assembly subset of said power converter module with at least two switch assemblies and providing a second assembly subset of said power converter module with at least two switch assemblies, said second assembly subset being complementary to said first assembly subset; and
using the power converter module to take up energy by switching off at least one semiconductor switch of at least one of said assembly subsets and switching on at least one semiconductor switch of said very same at least one assembly subset.

* * * * *